(12) United States Patent
Lee et al.

(10) Patent No.: US 12,051,569 B2
(45) Date of Patent: *Jul. 30, 2024

(54) DEPOSITION APPARATUS AND DEPOSITION METHOD USING THE SAME

(71) Applicant: Samsung Display Co., LTD., Yongin-si (KR)

(72) Inventors: Kwan Yong Lee, Pyeongtaek-si (KR); Yong Kuk Kim, Suwon-si (KR); Ji Hoon Shin, Asan-si (KR); Chang Jo Lee, Cheonan-si (KR); Sung Ryul Cho, Asan-si (KR); Sang Jin Ha, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/133,408

(22) Filed: Apr. 11, 2023

(65) Prior Publication Data

US 2023/0253190 A1     Aug. 10, 2023

Related U.S. Application Data

(63) Continuation of application No. 17/163,335, filed on Jan. 29, 2021, now Pat. No. 11,637,001.

(30) Foreign Application Priority Data

May 28, 2020   (KR) .................. 10-2020-0064080

(51) Int. Cl.
*H01J 37/32*    (2006.01)
*C23C 14/34*    (2006.01)
*C23C 14/35*    (2006.01)

(52) U.S. Cl.
CPC .... *H01J 37/32559* (2013.01); *C23C 14/3407* (2013.01); *C23C 14/3471* (2013.01);
(Continued)

(58) Field of Classification Search
None
See application file for complete search history.

(56) References Cited

U.S. PATENT DOCUMENTS

| 5,736,021 A | 4/1998 | Ding et al. |
| 6,162,297 A * | 12/2000 | Mintz ................ C23C 16/4404 |
| | | 204/298.11 |

(Continued)

FOREIGN PATENT DOCUMENTS

| CN | 108441835 | 2/2020 |
| EP | 1746181 | 1/2007 |

(Continued)

OTHER PUBLICATIONS

Extended European Search Report—European Application No. 21176106.9 dated Oct. 27, 2021.

*Primary Examiner* — Jason Berman
(74) *Attorney, Agent, or Firm* — CANTOR COLBURN LLP

(57) ABSTRACT

A deposition apparatus includes a shield member having a lattice shape in a plan view, the lattice shape including short side edges extending along a first direction and long side edges extending along a second direction, the short side edges including first and second short side edges, a bracket member including a first bracket member coupled to the first short side edge, and a second bracket member coupled to the second short side edge, a plurality of anode bars extending along the second direction and stably placed on each of the first bracket member and the second bracket member, and a target member covering the plurality of anode bars. An anode bar of the plurality of anode bars protrudes outward beyond at least one of the first bracket member and the second bracket member, and the anode bar is physically separated from the shield member by the bracket member.

14 Claims, 16 Drawing Sheets

(52) U.S. Cl.
CPC ...... *C23C 14/351* (2013.01); *H01J 37/32651* (2013.01); *H01J 37/3266* (2013.01); *H01J 37/32807* (2013.01)

(56) References Cited

U.S. PATENT DOCUMENTS

| | | |
|---|---|---|
| 2004/0099817 A1 | 5/2004 | Demos et al. |
| 2007/0012558 A1 | 1/2007 | White et al. |
| 2007/0261951 A1 | 11/2007 | Ye et al. |
| 2008/0011601 A1* | 1/2008 | Lau .................. H01J 37/34 204/192.1 |
| 2012/0000773 A1 | 1/2012 | Ye et al. |

FOREIGN PATENT DOCUMENTS

| | | |
|---|---|---|
| KR | 20010050590 | 6/2001 |
| KR | 1020040044935 | 5/2004 |
| KR | 100672629 | 1/2007 |
| KR | 100751174 | 8/2007 |
| KR | 1020080059835 | 1/2008 |
| KR | 1020080061911 | 7/2008 |
| KR | 1020170005347 | 1/2017 |
| KR | 1020180051693 | 5/2018 |
| WO | 2007118204 | 10/2007 |

\* cited by examiner

FIG. 9

| Improved Product | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| Initial Stage | | | 68 | 73 | 73 | 75 | 83 | 83 | 83 | 87 | 78 | 81 | 70 | 77 | 78 | 75 | 86 | 78 | 76 | | |
| Late Stage | | | 63 | 67 | 67 | 70 | 78 | 76 | 77 | 80 | 72 | 76 | 66 | 71 | 72 | 70 | 80 | 72 | 70 | | |
| Change Amount | | | 5 | 6 | 6 | 5 | 5 | 7 | 6 | 7 | 6 | 5 | 4 | 6 | 6 | 5 | 6 | 6 | 6 | | |

FIG. 10

| Improved Product | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| Initial Stage | | | 70 | 72 | 72 | 76 | 80 | 81 | 81 | 85 | 80 | 82 | 78 | 73 | 72 | 79 | 84 | 86 | 78 | | |
| Late Stage | | | 62 | 61 | 62 | 67 | 70 | 72 | 70 | 74 | 68 | 71 | 69 | 63 | 62 | 69 | 75 | 76 | 70 | | |
| Change Amount | | | 8 | 11 | 10 | 9 | 10 | 9 | 11 | 11 | 12 | 11 | 9 | 10 | 10 | 10 | 9 | 10 | 8 | | |

DEPOSITION APPARATUS AND DEPOSITION METHOD USING THE SAME

This application is a continuation of U.S. patent application Ser. No. 17/163,335, filed on Jan. 29, 2021, which claims priority to Korean Patent Application No. 10-2020-0064080 filed on May 28, 2020, and all the benefits accruing therefrom under 35 U.S.C. § 119, the content of which in its entirety is herein incorporated by reference.

BACKGROUND

1. Field

Embodiments of the invention relate to a deposition apparatus and a deposition method using the same.

2. Description of the Related Art

Electronic apparatuses providing images to users, such as a smartphone, a tablet personal computer ("PC"), a digital camera, a laptop computer, a navigation device and a smart television, include display devices for displaying images. The display device may include a display panel for generating and displaying an image and may further include various input devices.

The display devices may include a plurality of conductive films and an insulating film arranged between the plurality of conductive films, and the plurality of conductive films may be formed or deposited by a deposition apparatus.

The deposition apparatus may sputter a target member to deposit a film forming material of a target member on a substrate facing the target member.

SUMMARY

Sputtering a target member is carried out with plasma, and a lack of uniformity of plasma is likely to decrease a uniformity of a deposited film.

Features of the invention provide a deposition apparatus that is capable of improving uniformity of a deposited film.

Features of the invention also provide a deposition method that is capable of improving uniformity of a deposited film.

In an embodiment, a deposition apparatus includes a shield member having a lattice shape in a plan view, the lattice shape including short side edges extending along a first direction and long side edges extending along a second direction crossing the first direction, the short side edges including a first short side edge and a second short side edge, a bracket member including a first bracket member disposed on the first short side edge and coupled to the first short side edge, and a second bracket member disposed on the second short side edge and coupled to the second short side edge, a plurality of anode bars extending along the second direction and stably placed on each of the first bracket member and the second bracket member, and a target member covering the plurality of anode bars, where an anode bar of the plurality of anode bars protrudes outward beyond at least one of the first bracket member and the second bracket member, and the anode bar is physically separated from the shield member by the bracket member.

In an embodiment, each of the first bracket member and the second bracket member may include a fixing member, a hole may be defined in the fixing member of the first bracket member, a groove may be defined in the fixing member of the second bracket, and the anode bar protrudes outward through the hole of the first bracket member, and is stably placed in the groove of the second bracket member.

In an embodiment, the plurality of anode bars may be spaced apart along the first direction and electrically grounded.

In an embodiment, the anode bar has a first width, adjacent anode bars of the plurality of anode bars may be spaced apart at a first separation distance, and the first separation distance may be equal to or greater than double the first width.

In an embodiment, a long side edge of the long side edges of the shield member has a first length, and the anode bar has a second length shorter than the first length.

In an embodiment, the shield member includes an upper shield member coupled to the bracket member, and the upper shield member includes a first extension portion coupled to the bracket member, and a second extension portion connected to the first extension portion, disposed on a lateral side of the anode bar and extending along a third direction perpendicular to the first and second directions.

In an embodiment, the shield member includes a lower shield member spaced apart from the bracket member, and the lower shield member includes a third extension portion disposed on a lateral side of the target member, and a fourth extension portion connected to the third extension portion, extending along the third direction and disposed on a lateral side of the anode bar.

In an embodiment, the deposition apparatus may further include a backing plate for supporting the lower shield member and the target member.

In an embodiment, the deposition apparatus may further include an insulating member disposed below the backing plate.

In an embodiment, the deposition apparatus may further include a magnetic member disposed below the target member.

In an embodiment, the deposition apparatus may further include a mask member disposed on an inner side of the upper shield member, where the mask member may be electrically floated, and may have a lattice shape surrounding a first opening in the plan view.

In an embodiment, a film forming material of the target member may be deposited on a substrate facing the target member.

In an embodiment, the target member includes a film forming material, and the film forming material includes metal or metal oxide.

In an embodiment, the anode bar functions to deposit the film forming material uniformly on the substrate.

In an embodiment, each of the anode bar and the bracket member includes an embossed pattern on a surface thereof.

In an embodiment, the anode bar has a first width, adjacent anode bars of the plurality of anode bars are spaced apart at a predetermined separation distance, the predetermined separation distance of the adjacent anode bars is equal to or greater than double the first width, the predetermined separation distance has a first separation distance in an outer area of the deposition apparatus and a second separation distance in a central area of the deposition apparatus, and the first separation distance is smaller than the second separation distance.

In another embodiment, a deposition method comprises preparing a deposition apparatus including a shield member having a lattice shape in a plan view, the lattice shape including short side edges extending along a first direction and long side edges extending along a second direction crossing the first direction, the short side edges including a first short side edge and a second short side edge, a bracket member including a first bracket member disposed on the first short side edge and coupled to the first short side edge, and a second bracket member disposed on the second short side edge and coupled to the second short side edge, a plurality of anode bars extending along the second direction and stably placed on each of the first bracket member and the second bracket member, and a target member covering the plurality of anode bars, and arranging a substrate to face the target member in a state of being separated from the target member across the plurality of anode bars interposed therebetween, where an anode bar of the plurality of anode bars protrudes outward beyond at least one of the first bracket member and the second bracket member, and the anode bar is physically separated from the shield member by the bracket member.

In an embodiment, in the preparing the deposition apparatus, each of the first bracket member and the second bracket member may include a fixing member, a hole may be defined in the fixing member of the first bracket member, a groove may be defined in the fixing member of the second bracket member, and the anode bar protrudes outward through the hole of the first bracket member, and is stably placed in the groove of the second bracket member.

In an embodiment, in the preparing the deposition apparatus, the plurality of anode bars may be spaced apart along the first direction and electrically grounded.

In an embodiment, the deposition method further comprises forming a cathode on the target member to form plasma between the plurality of anode bars and the target member.

In an embodiment, the deposition method further comprises sputtering the target member using the plasma to deposit a film forming material of the target member on the substrate.

However, features of the invention are not restricted to those set forth herein. The above and other features of the invention will become more apparent to one of ordinary skill in the art to which the invention pertains by referencing the detailed description of the invention given below.

The deposition apparatus and method in embodiments may be able to improve uniformity of the deposited film.

The effects of the invention are not limited to the aforementioned effects, and various other effects are included in the specification.

BRIEF DESCRIPTION OF THE DRAWINGS

The above and other embodiments, features and advantages of the invention will become more apparent by describing in detail embodiments thereof with reference to the attached drawings, in which:

FIG. 9 is a table showing a separation distance between a substrate and an anode bar in an improved product;

FIG. 10 is table showing a separation distance between a substrate and an anode bar in a conventional product;

DETAILED DESCRIPTION

Figure 1:
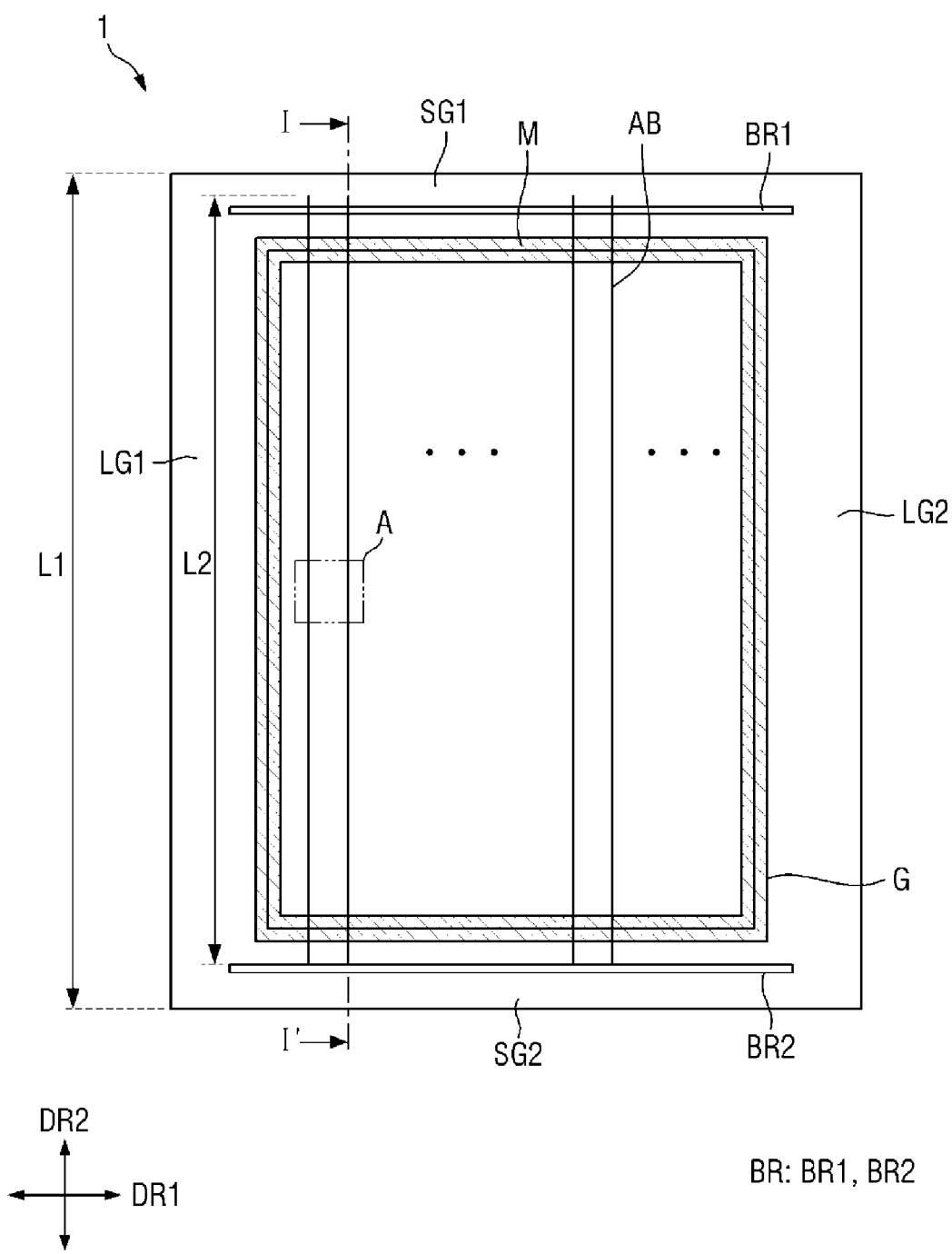
FIG. 1 is a plan view of an embodiment of a deposition apparatus.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the drawing figures. It will be understood that relative terms are intended to encompass different orientations of the device in addition to the orientation depicted in the drawing figures. For example, if the device in one of the drawing figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the drawing figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described with reference to the attached drawings.

FIG. 1 is a plan view of an embodiment of a deposition apparatus.

With reference to FIG. 1, the display device may include a plurality of conductive films and an insulating film arranged between the plurality of conductive films, the conductive films being provided or deposited by a deposition apparatus 1 to be described later.

In an embodiment, the deposition apparatus 1 may be a deposition apparatus for forming the plurality of conductive films of the display device.

In an embodiment, the deposition apparatus 1 may perform sputtering a target member to deposit a film forming material of the target member on a substrate facing the target member. Hereinafter, the components of the deposition apparatus 1 and the connection relationship thereof will be described in detail.

In an embodiment, the deposition apparatus 1 may include a shield member S, a bracket member BR, a mask member M, and an anode bar AB.

In more detail, the shield member S may have a lattice shape in a plan view.

In the embodiments, the first direction DR1 and the second direction DR2 cross each other in different directions. In the plan view of FIG. 1, a horizontal direction is defined as the first direction DR1 and a vertical direction is defined as the second direction DR2 for convenience of explanation. In the following embodiments, one side of the first direction DR1 represents a direction toward the right side in the plan view, and the other side of the first direction DR1 represents a direction toward the left side in the plan view. One side of the second direction DR2 represents an upward direction in the plan view, and the other side of the second direction DR2 represents a downward direction in the plan view. It should be understood, however, that a direction mentioned in the embodiment refers to a relative direction and the embodiment is not limited to the direction mentioned.

The lattice-shaped shield member S may include short side edges extending along the first direction DR1 and long side edges extending along the second direction DR2. The lattice-shaped shield member S may define an opening surrounded thereby. That is, the opening of the shield member S may be completely surrounded by the lattice-shaped shield member S in the plan view. The opening of the shield member S may have a quadrangular (e.g., rectangular) shape in the plan view. However, the invention is not limited thereto, and the opening of the shield member S may have a shape of a square, a circle, an ellipse, or a polygon in the plan view.

The short side edges of the lattice-shaped shield member S may include an upper short side edge SG1 disposed at one side in the second direction DR2 and a lower short side edge SG2 disposed at the other side in the second direction DR2 to face the upper short side edge SG1.

The long side edges of the lattice-shaped shield member S may include a right long side edge LG2 disposed at one side in the first direction DR1 and a left long side edge LG1 disposed at the other side in the first direction DR1 to face the right long side edge LG2.

A length L1 of the long side edges of the lattice-shaped shield member S may be greater than a length L2 of the anode bar AB to be described later.

The shield member S may include a conductive material. A ground voltage may be applied to the shield member S. The shield member S may act as an anode for plasma generation.

Furthermore, the shield member S may prevent the film forming material of the target member TG sputtered by the plasma from dispersing outward to prevent contamination of the chamber.

The mask member M may be arranged on the inner side surface of the shield member S. The mask member M may be arranged along the long side edges and the short side edges of the shield member S. The mask member M may have a lattice shape in the plan view. The mask member M may include long side edges adjacent to the long side edges of the shield member S and short side edges adjacent to the short side edges of the shield member S. An opening (refer to OP in FIG. 2) may be defined in and surrounded by the lattice-shaped mask member M. That is, the opening of the mask member M may be completely surrounded by the lattice-shaped mask member M. The opening of the mask member M may be smaller in size than the opening of the above-described shield member S. The opening of the mask member M may have a quadrangular (e.g., rectangular) shape in the plan view. However, the invention is not limited thereto, and the opening of the mask member M may have a shape of a square, a circle, an ellipse, or a polygon in the plan view.

The mask member M may be floated. This may prevent the film forming material from being further deposited on both sides of the substrate G during the deposition of the film forming material, thereby preventing non-uniformity of film formation.

The substrate G may be arranged on the deposition apparatus 1. The substrate G may be understood as a component separate from the deposition apparatus 1. However, the substrate G may also be understood as a component of the deposition apparatus 1.

The substrate G may overlap the opening of the above-described shield member S in the thickness direction. The substrate G may be arranged in the opening of the above-described shield member S. That is, the substrate G may be smaller in planar size than the opening of the shield member S.

The substrate G may include a rigid material such as glass or quartz. However, the invention is not limited thereto, and the substrate G may include a flexible material such as polyimide.

The substrate G may also overlap the opening of the mask member M in a third direction DR3 (hereinafter, also referred to as a thickness direction). The substrate G may be greater in planar size than the opening of the above-described mask member M. That is, the substrate G may partly overlap the long and short side edges of the mask member M in the thickness direction.

The bracket member BR may be arranged on the short side edges of the shield member S. The bracket member BR may include a first bracket member BR1 arranged on the upper short side edge SG1 and a second bracket member BR2 arranged on the lower short side edge SG2. The bracket member BR may extend along the first direction DR1. The bracket member BR may be arranged on the inner side of the shield member S.

The bracket member BR may fix the anode bar AB to be described later. The bracket member BR may be electrically connected with the shield member S. The ground voltage applied to the shield member S may be applied to the anode bar AB connected to the bracket member BR.

Furthermore, the bracket member BR may physically separate the anode bar AB and the shield member S from each other.

The anode bar AB may extend along the second direction DR2. In an embodiment, a plurality of anode bars AB may be provided. The plurality of anode bars AB may be arranged along the first direction DR1. The anode bar AB may be coupled to the bracket member BR. The anode bar AB may be coupled to each of the first bracket member BR1 and the second bracket member BR2. The anode bar AB may protrude outward (in the second direction DR2) beyond at least one of the first and second bracket members BR1 and BR2 in the plan view. In an embodiment, the anode bar AB may protrude (or extend) outward (at one side in the second direction DR2) beyond the first bracket member BR1 and terminate inside the second bracket member BR2, for example.

In some embodiments, the anode bar AB may also extend along the first direction DR1. In an embodiment, a plurality of anode bars AB may be provided. The plurality of anode bars AB may be arranged along the second direction DR2. In the embodiment in which the anode bar AB extends along the first direction DR1, it may be possible to further shorten the length L2 of the anode bar AB that is already shorter than the length L1 of the shield member S to minimize the deflection of the anode bar AB shown in FIG. 2 toward the target member TG as will be described later.

Figure 2:
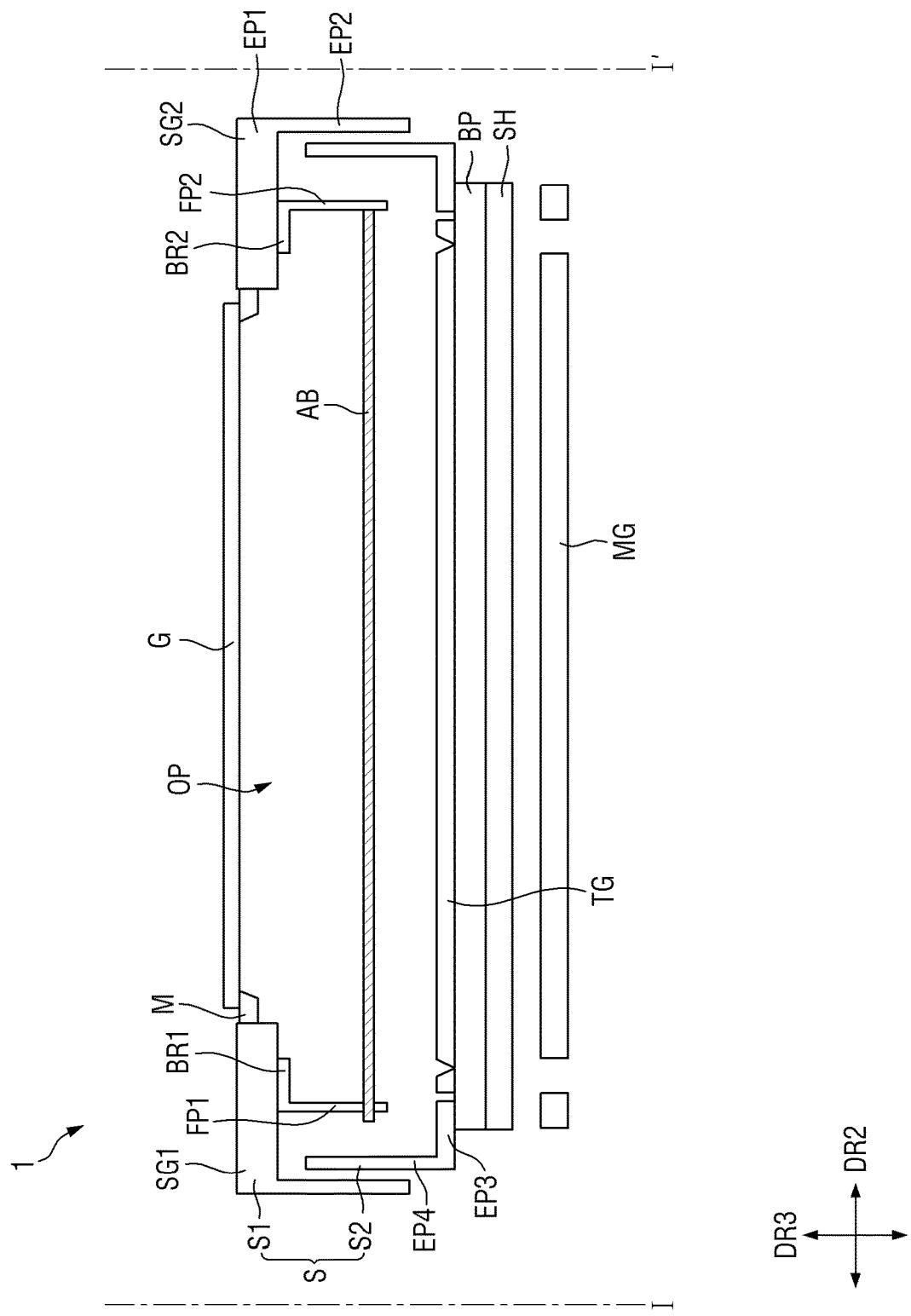
FIG. 2 is a cross-sectional view taken along line I-I' of FIG. 1.

FIG. 2 is a cross-sectional view taken along line I-I' of FIG. 1.

With reference to FIGS. 1 and 2, the shield member S may include an upper shield member S1 and a lower shield member S2. The lower shield member S2 may be disposed below the upper shield member S1. In more detail, the upper shield member S1 may be connected to the bracket member BR. The upper shield member S1 may include a first extension portion EP1 extending along the second direction DR2 and coupled to the bracket member BR and a second extension portion EP2 connected to the first extension portion EP1, disposed on the lateral side of the anode bar AB and extending along the thickness direction.

The lower shield member S2 may be physically separated from the bracket member BR2. The lower shield member S2 may include a third extension portion EP3 disposed on the lateral side of the target member TG and a fourth extension portion EP4 connected to the third extension portion EP3, extending along the thickness direction, and disposed on the lateral side of the anode bar AB.

The upper shield member S1 may have, for example, a '⌐' shape to be laterally symmetrical, and the lower shield member S2 may have, for example, a '∟' shape to be laterally symmetrical, without being limited thereto.

The mask member M may adjoin the short and long side edges of the upper shield member S1. Although it is depicted in FIGS. 1 and 2 that the mask member M adjoins the short and long side edges of the upper shield member S1, the mask member M may actually be separated from the short and long side edges of the upper shield member S1 by an insulating member interposed therebetween. This may make it possible for the mask member M to remain in the floating state even though the ground voltage is applied to the shield member S.

As described above, the substrate G may be arranged on the mask member M to cover the opening of the mask member M.

The first and second bracket members BR1 and BR2 may be connected to the bottom surfaces of the corresponding short side edges SG1 and SG2. The first bracket member BR1 may be connected to the upper short side edge SG1, and the second bracket member BR2 may be connected to the lower short side edge SG2. The bracket members BR1 and BR2 may include horizontal portions connected to the short side edges SG1 and SG2 and extending along the second direction DR2 and vertical portions bent from the horizontal portions to extend along the thickness direction. Although the first and second bracket members BR1 and BR2 may have, for example, a '¬' shape to be laterally symmetrical, the invention is not limited thereto.

In an embodiment, the anode bar AB may be separated from the upper shield member S1 by the bracket member BR. This may make it possible to avoid proximity or contact of the anode bar AB with the upper shield member S1, which may prevent or minimize a warpage phenomenon due to thermal expansion caused by the increase of the temperature of the anode bar AB along with the upper shield member S1 when the plasma is produced.

Figure 4:
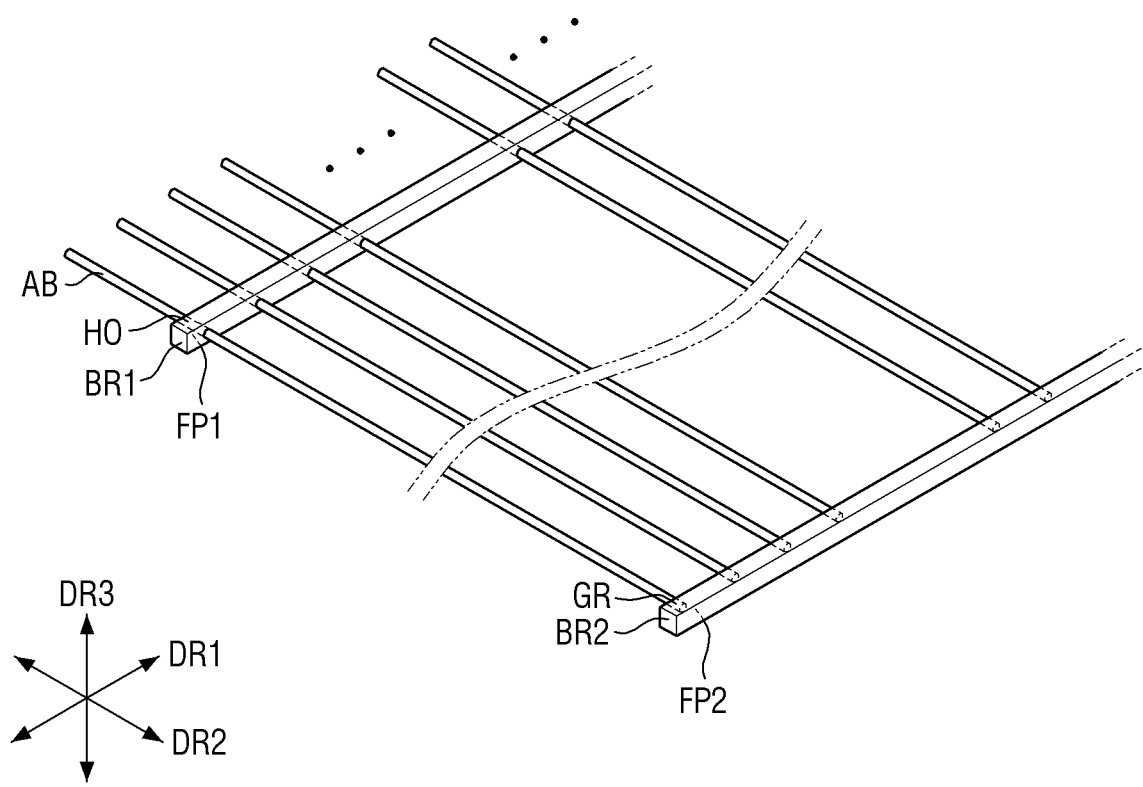
FIG. 4 is a perspective view showing an embodiment of a connection relationship of anode bars and bracket members.

FIG. 4 is a perspective view showing an embodiment of a connection relationship of anode bars and bracket members.

With reference to FIG. 4, the first and second bracket members BR1 and BR2 may include respective fixing members FP1 and FP2. A hole or a groove may be defined in each of the fixing members FP1 and FP2. In an embodiment, a hole HO may be defined in the fixing members FP1 of the first bracket member BR1, and a groove GR may be defined in the fixing member FP2 of the second bracket member BR2, for example. Here, a hole may mean a space penetrating though a fixing member, and a groove may mean a space penetrating only a portion of a fixing member.

In this case, the anode bar AB may be stably placed or fixed by the first bracket member BR1 so as to protrude (or extend) outward (in the second direction DR2) beyond the fixing member FP1 of the first bracket member BR1 and simultaneously may be stably placed or fixed by the fixing member FP2 of the second bracket member BR2 so as to terminate inside the fixing member FP2.

The anode bar AB may be stably placed by the first bracket member BR1 so as to protrude (or extend) outward (in the second direction DR2) beyond the fixing member FP1 of the first bracket member BR1 and simultaneously may be stably placed or fixed by the fixing member FP2 of the second bracket member BR2 so as to terminate inside the fixing member FP2, thereby allowing the anode bar AB which is not completely fixed to the first bracket member BR1 to sufficiently accommodate the thermal expansion caused by the heat produced by the plasma. This may make it possible to avoid any deflection of the anode bar AB caused by fixing the anode bar AB at both ends thereof, due to the thermal expansion.

The target member TG and the substrate G may cover a plurality of anode bars AB.

The target member TG may face the substrate G across the plurality of anode bars AB interposed therebetween. The target member TG may be greater in size than the substrate G, but is not limited thereto and may be substantially equal in size to the substrate G.

The target member TG may include a film forming material. The film forming material may include metal or metal oxide. In an embodiment, the film forming material may include, but is not limited thereto, aluminum (Al), molybdenum (Mo), titanium (Ti), silver (Ag), or indium tin oxide ("ITO"), for example.

A cathode is applied to the target member TG such that plasma may be produced between the cathode of the target member TG and the anode of the anode bar AB and the shield member S.

The deposition apparatus 1 may further include a backing plate BP for supporting the target member TG and the lower shield member S2. The backing plate BP may support the above-described target member TG and the lower shield member S2.

The deposition apparatus 1 may further include a shield layer SH arranged on the bottom surface of the backing plate BP. The shield layer SH may include an insulating material. Although not shown in FIG. 2, a common plate may be arranged on the bottom surface of the shield layer SH and the side surfaces of the shield layer SH, the backing plate BP, and the target member TG. The common plate may include the same conductive material as that of the above-described shield member S. The shield layer SH may electrically isolate the backing plate BP and the target member TG from the common plate including the conductive material.

A magnetic member MG may be further arranged below the shield layer SH.

The magnetic member MG may include a ferromagnetic substance. The magnetic member MG may guide the plasma to the surface of the target member TG. As a consequence, the plasma may effectively bombard the target member TG to facilitate the sputtering process.

As described above, the ground voltage may be applied to the plurality of anode bars AB, which may overlap the target member TG and the opening of the shield member S in the thickness direction. As a consequence, the anode exists even in the opening of the shield member S, so that plasma having a substantially uniform intensity may be induced at the center and edge portions of the surface of the target member TG. When plasma having a substantially uniform intensity is induced at the center and edge portions of the surface of the target member TG, it may be possible to deposit a film having a uniform thickness on the substrate G.

Figure 3:
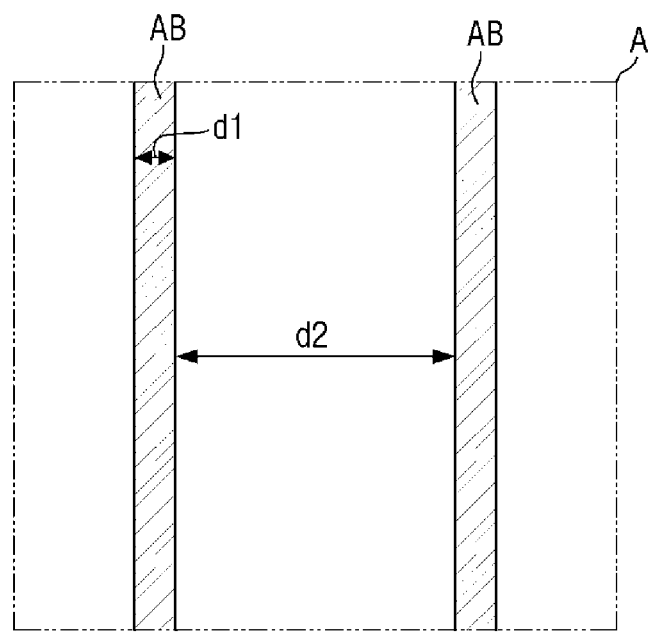
FIG. 3 is an enlarged view of area A of FIG. 1.
Figure 3:
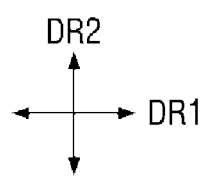

FIG. 3 is an enlarged view of area A of FIG. 1.

With reference to FIG. 3, the anode bar AB may have a first width d1, and the adjacent anode bars AB may be spaced apart from each other at a first separation distance d2.

The first width d1 may be equal to or less than 50% of the first separation distance d2. That is, the first separation distance d2 may be equal to or greater than double the first width d1. This may make it possible to reduce the amount of the substantially sputtered film forming material deposited on the anode bars AB rather than the substrate G.

Figure 5:
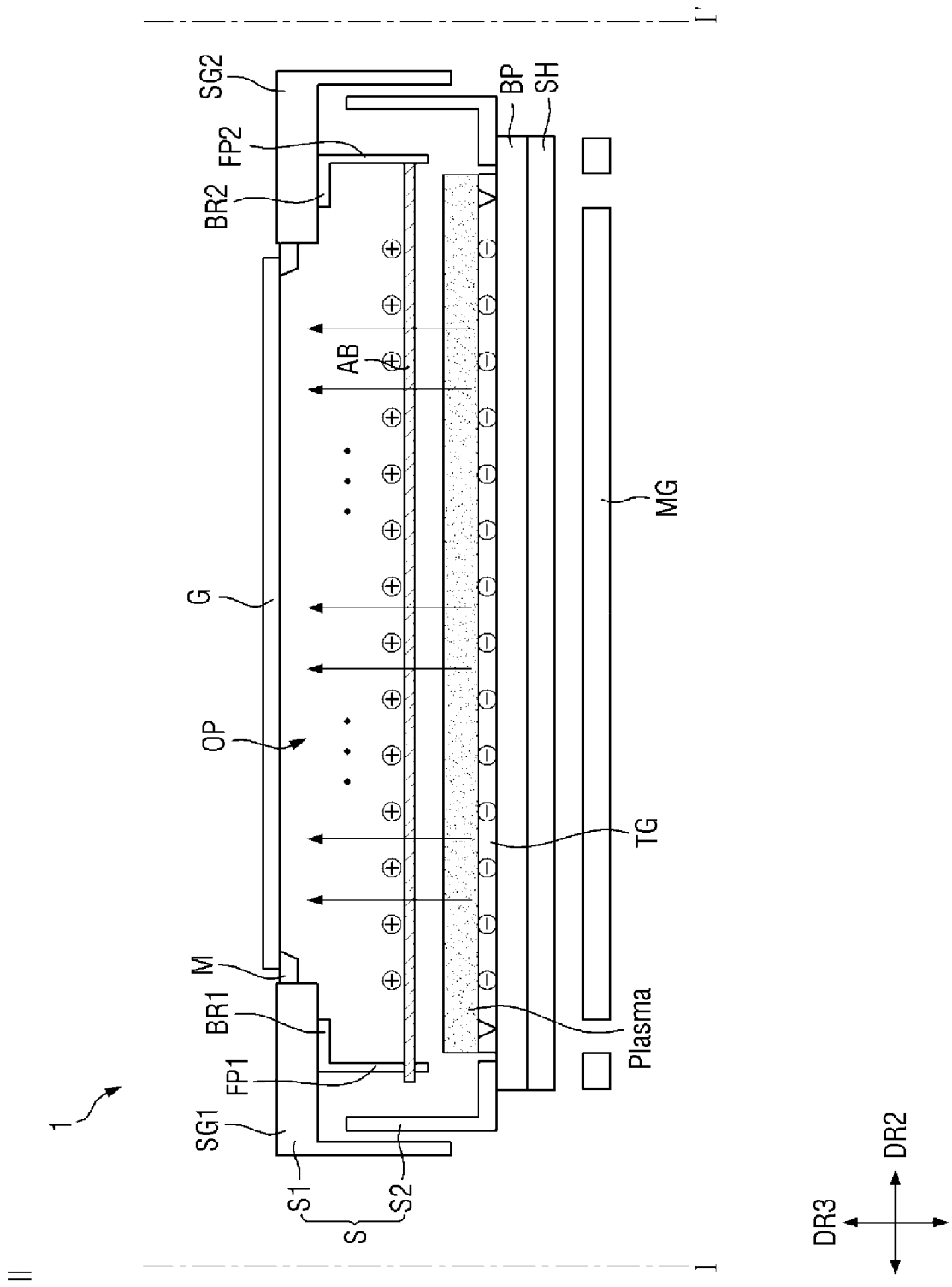
FIG. 5 is a schematic view illustrating an embodiment of a deposition apparatus producing plasma for sputtering.

FIG. 5 is a schematic view illustrating an embodiment of a deposition apparatus producing plasma for sputtering.

With reference to FIG. 5, as described above, the cathode is applied to the target member TG and the anode is applied to the shield member S and the anode bars AB such that plasma is produced between the target member TG and the shield member S and anode bars AB.

In an embodiment, the anode exists even in the opening of the shield member S, so that plasma having a substantially uniform intensity may be induced at the center and edge portions of the surface of the target member TG.

When the intensity of the plasma is stronger than the bonds of atoms in the target member TG, the film forming material may be sputtered on the surface of the target member TG by the plasma. The film forming material sputtered from the target member TG may be deposited on the substrate G in an order as shown in the drawing.

In an embodiment, because plasma having a substantially uniform intensity is induced at the center and edge portions of the surface of the target member TG, it may be possible to deposit a film having a uniform thickness on the substrate G.

Although the anode bars AB are separated from the upper shield member S1 by the bracket member BR and stably placed by the first bracket BR1 to protrude (or extend) outward (in the second direction DR2) beyond the fixing member FP1 of the first bracket member BR1 as described above, the anode bars AB themselves may be deflected by the plasma. A description thereof is made hereinafter.

Figure 6:
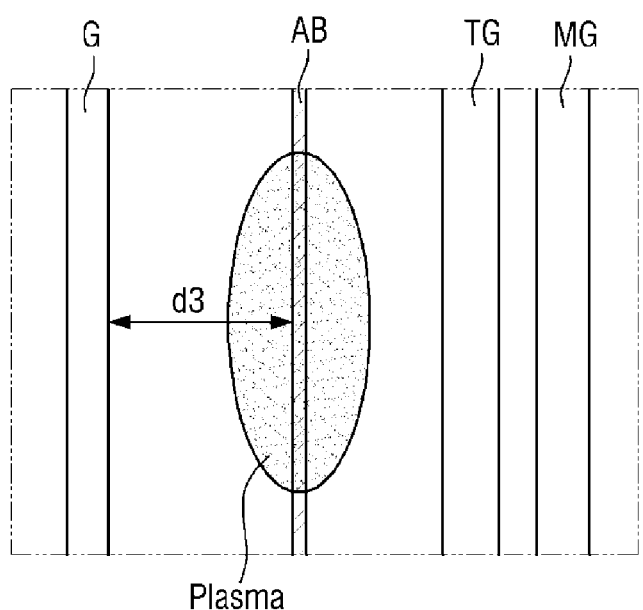
FIG. 6 is a schematic view illustrating a separation distance between a substrate and an anode bar before deflection of the anode bar.
Figure 7:
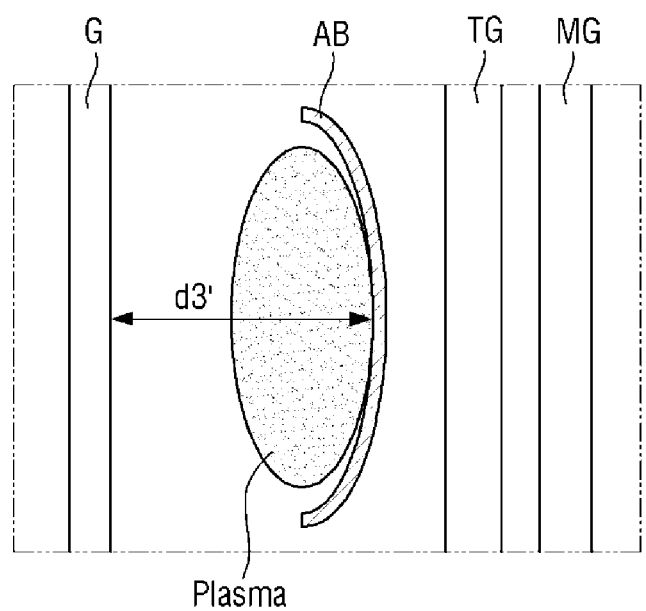
FIG. 7 is a schematic view illustrating a separation distance between a substrate and an anode bar after deflection of the anode bar.
Figure 8:
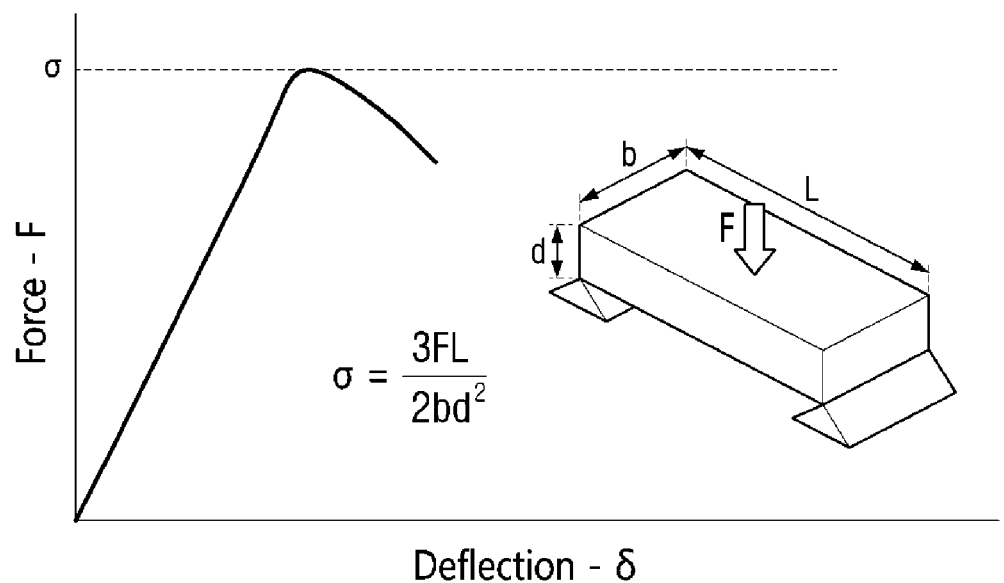
FIG. 8 is a graph showing the degree of deflection according to a length of an anode bar.

FIG. 6 is a schematic view illustrating a separation distance between a substrate and an anode bar before deflection of the anode bar. FIG. 7 is a schematic view illustrating a separation distance between a substrate and an anode bar after deflection of the anode bar. FIG. 8 is a graph showing the degree of deflection according to a length of an anode bar. FIG. 9 is a table showing a separation distance between a substrate and an anode bar in an improved product. FIG. 10 is table showing a separation distance between a substrate and an anode bar in a conventional product.

First, with reference to FIGS. 6 and 7, in the case where a predetermined time period elapses after the plasma is generated or the intensity of the plasma is greater than a predetermined level, the original separation distance d3 between the anode bar AB and the substrate G may decrease to another separation distance d3' as shown in FIG. 7. Here, each of the separation distances d3 and d3' denotes a distance from the center of the anode bar AB to the substrate G (or the largest separation distance between the anode bar AB and the substrate G).

When the original separation distance d3 between the anode bar AB and the substrate G decreases to the separation distance d3', this means that the anode bar AB is deflected to be convex toward the target member TG by the plasma generated between the target member TG and the substrate G.

The degree of deflection of the anode bar AB toward the target member TG is related to the length of the anode bar AB as shown in FIG. 8.

With further reference to FIG. 1, the length L2 of the anode bar AB may be determined to be shorter than the length L1 of the shield member S to minimize the deflection of the anode bar AB toward the target member TG.

With reference to FIGS. 9 and 10, it was identified, in an embodiment, that a change amount (d3'-d3) of the separation distance before and after generation of plasma is about 4 to 6 in the samples (or improved products) of the anode bar AB of which the length L2 is less than the length L1 of the shield member S to minimize the deflection of the anode bar AB toward the target member TG, and about 8 to 12 in the samples (or conventional products) of the anode bar AB of which the length L2 is greater than the length L1 of the shield member S.

The deposition apparatus 1 in an embodiment is capable of preventing non-uniformity of film formation caused by the film forming material being more deposited on both sides of the substrate G during the deposition of the film forming material on the substrate G in such a way of arranging the floated mask member M on the inner side surface of the shield member S.

The anode bar AB may also be separated from the upper shield member S1 by the bracket member BR. This may make it possible to avoid proximity or contact of the anode bar AB with the upper shield member S1, which may prevent or minimize a warpage phenomenon due to thermal expansion caused by the increase of the temperature of the anode bar AB along with the upper shield member S1 when the plasma is produced.

Furthermore, the anode bar AB may be stably placed by the first bracket member BR1 so as to protrude (or extend) outward (in the second direction DR2) beyond the fixing member FP1 of the first bracket member BR1 and simultaneously may be stably placed or fixed by the fixing member FP2 of the second bracket member BR2 so as to terminate inside the fixing member FP2, thereby allowing the anode bar AB which is not completely fixed to the first bracket member BR1 to sufficiently accommodate the thermal expansion caused by the heat produced by the plasma. This may make it possible to avoid any deflection of the anode bar AB caused by fixing the anode bar AB at both ends thereof, due to the thermal expansion.

Furthermore, the length L2 of the anode bar AB may be determined to be shorter than the length L1 of the shield member S to minimize the deflection of the anode bar AB toward the target member TG.

Hereinafter, a deposition apparatus according to another embodiment will be described. In the following embodiment, the same components as those of the above-described embodiment are denoted by the same reference numerals, and a description thereof will be omitted or simplified.

Figure 11:
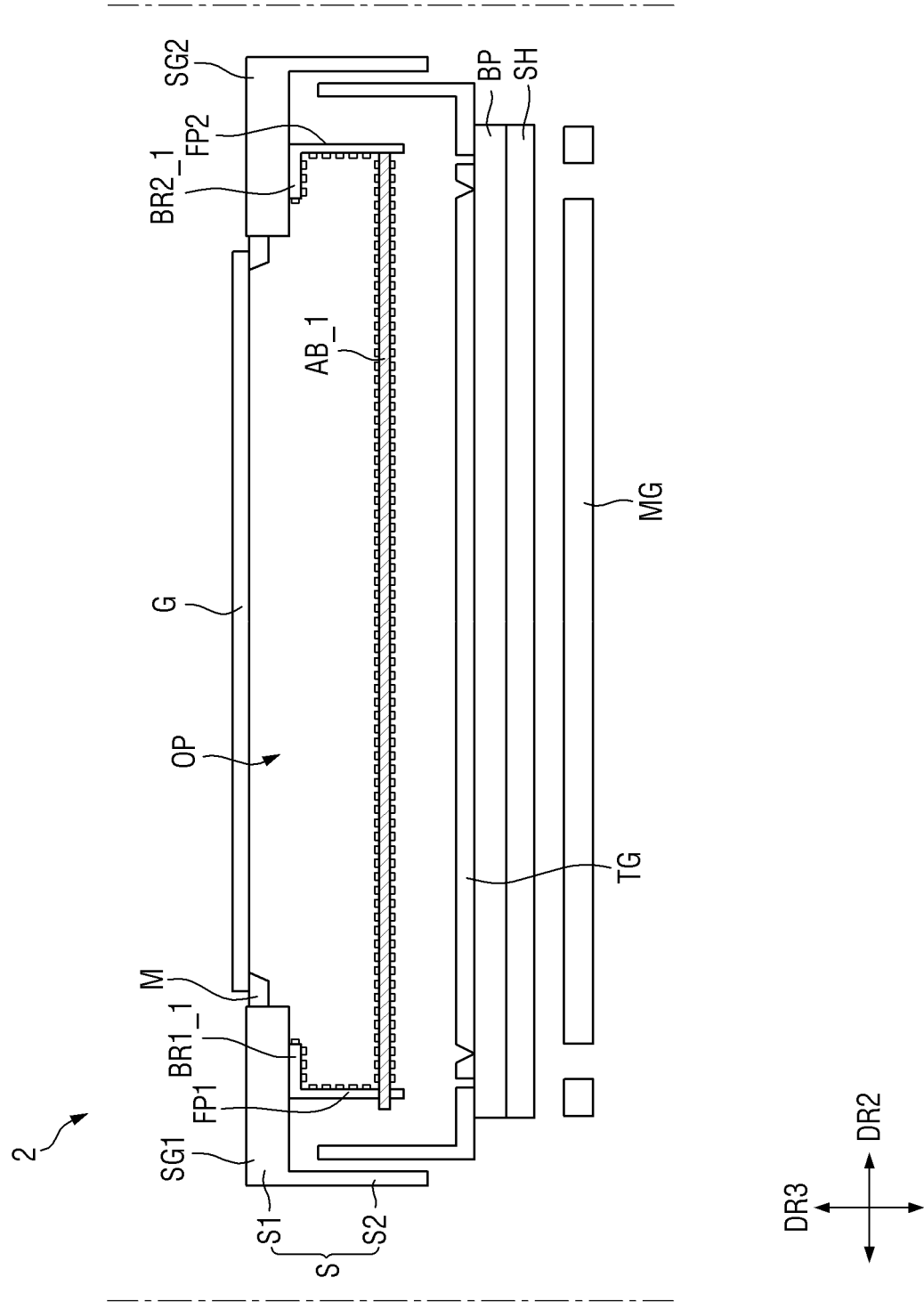
FIG. 11 is a cross-sectional view of another embodiment of a deposition apparatus.
Figure 12:
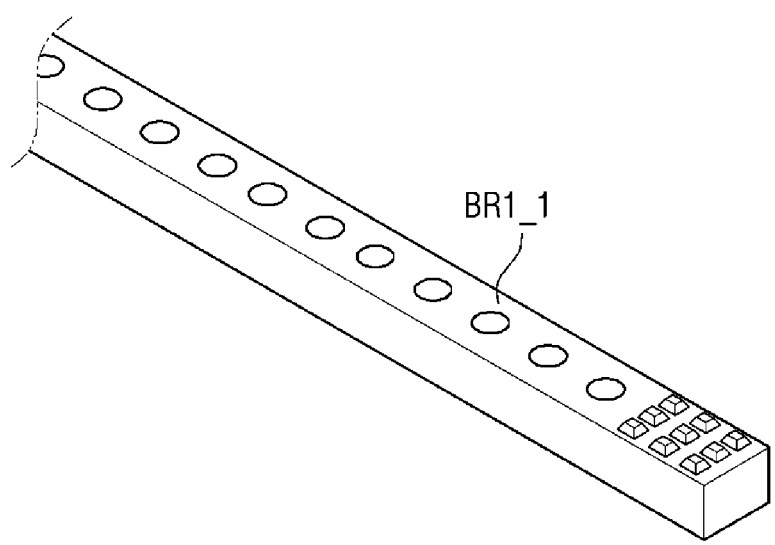
FIG. 12 is an enlarged perspective view of another embodiment of a first bracket member.

FIG. 11 is a cross-sectional view of another embodiment of a deposition apparatus. FIG. 12 is an enlarged perspective view of another embodiment of a first bracket member.

With reference to FIGS. 11 and 12, a deposition apparatus 2 according to this embodiment differs from the deposition apparatus 1 according to the above embodiment in including an anode bar AB_1 and bracket members BR1_1 and BR2_1.

In more detail, the deposition apparatus 2 according to this embodiment may include the anode bar AB_1 and bracket members BR1_1 and BR2_1. This embodiment is described with further reference to FIGS. 1 to 10.

According to this embodiment, the anode bar AB_1 and the bracket members BR1_1 and BR2_1 may each include an embossed (or indented) pattern on one surface thereof.

In an embodiment, the embossed pattern of the anode bar AB_1 may include the same material as that of the anode bar AB_1 and may be unitary with the anode bar AB_1. In an embodiment, the embossed pattern of the bracket members BR1_1 and BR2_1 may include the same material as that of the bracket members BR1_1 and BR2_1 and may be unitary with the bracket members BR1_1 and BR2_1.

Each element of the embossed patterns on the surfaces of the anode bar AB_1 and the bracket members BR1_1 and BR2_1 may have a square shape in the plan view. The length of a side of the planar shape of the embossed pattern on the surfaces of the anode bar AB_1 and the bracket members BR1_1 and BR2_1 may be about 2 mm without being limited thereto. The embossed patterns of the anode bar AB_1 and bracket members BR1_1 and BR2_1 may differ in element size from each other.

The embossed patterns of the anode bar AB_1 and bracket members BR1_1 and BR2_1 may minimize or prevent particles being created on the surfaces of the anode bar AB_1 and the bracket members BR1_1 and BR2_1 by the sputtered film forming material.

In more detail, the embossed patterns of the anode bar AB_1 and the bracket members BR1_1 and BR2_1 may increase the surface area of the anode bar AB_1 and the bracket members BR1_1 and BR2_1, which may minimize damage caused by collision of the sputtered film forming material, leading to reduction of particle creation.

Other configurations are the same as those described above with reference to FIGS. 1 to 10, and thus, a repeated description will be omitted.

The deposition apparatus according to this embodiment may also be able to prevent non-uniformity of film formation caused by the film forming material being more deposited on both sides of the substrate G during the deposition of the film forming material on the substrate G in such a way of arranging the floated mask member M on the inner side surface of the shield member S.

The anode bar AB_1 may also be separated from the upper shield member S1 by the bracket members BR1_1 and BR2_1. This may make it possible to avoid proximity or contact of the anode bar AB_1 with the upper shield member S1, which may prevent or minimize a warpage phenomenon due to thermal expansion caused by the increase of the temperature of the anode bar AB along with the upper shield member S1 when the plasma is produced.

Furthermore, the anode bar AB_1 may be stably placed by the first bracket member BR1_1 so as to protrude (or extend) outward (in the second direction DR2) beyond the fixing member FP1 of the first bracket member BR1_1 and simultaneously may be stably placed or fixed by the fixing member FP2 of the second bracket member BR2_1 so as to terminate inside the fixing member FP1, thereby allowing the anode bar AB_1 which is not completely fixed to the first bracket member BR1_1 to sufficiently accommodate the thermal expansion caused by the heat produced by the plasma. This may make it possible to avoid any deflection of the anode bar AB_1 caused by fixing the anode bar AB_1 at both ends thereof, due to the thermal expansion.

Furthermore, the length L2 of the anode bar AB_1 may be determined to be shorter than the length L1 of the shield member S to minimize the deflection of the anode bar AB_1 toward the target member TG.

Other configurations are the same as those described above with reference to FIGS. 1 to 10, and thus, a repeated description is omitted.

Figure 13:
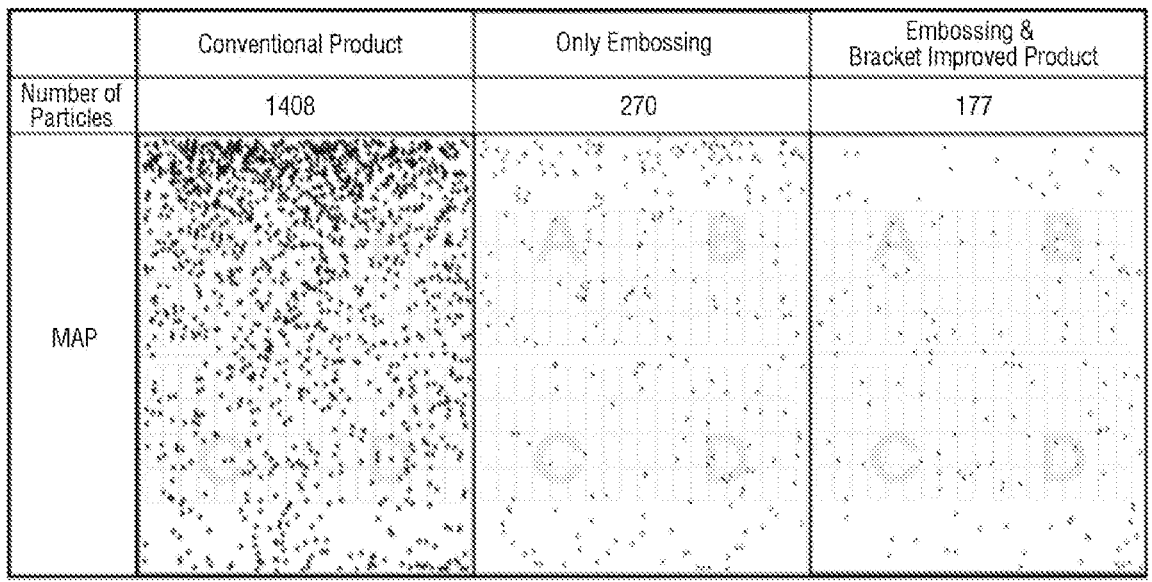
FIG. 13 is a table showing particle reduction effects in a convention product, a sample prepared by applying an embossed pattern to a convention product, and a sample of the deposition apparatus of FIG. 11.

FIG. 13 is a table showing particle reduction effects in a convention product, a sample prepared by applying an embossed pattern to a convention product, and a sample of the deposition apparatus of FIG. 11.

With reference to FIGS. 1 to 13, there are shown the conventional product (to which neither the embossed pattern nor the structure in which the length L2 of the anode bar AB is less than the length L1 of the shield member S is applied), the sample prepared by applying only the embossed pattern to the conventional product, and the sample prepared by applying the structure of FIG. 11.

As identified in FIG. 13, about 1408 particles were found in the conventional product (neither the embossed pattern nor the structure in which the length L2 of the anode bar AB is less than the length L1 of the shield member S is applied), about 270 particles were found in the sample prepared by applying the embossed pattern to the conventional product, and about 177 particles were found in the sample prepared by applying the structure of FIG. 11.

As described above, the embossed patterns of the anode bar AB_1 and the bracket members BR1_1 and BR2_1 may increase the surface area of the anode bar AB_1 and the bracket members BR1_1 and BR2_1, which may minimize damage caused by collision of the sputtered film forming material, leading to reduction of particle creation.

Hereinafter, a description includes an embodiment of a deposition method using the deposition apparatus. In the following embodiment, the same components as those of the above-described embodiment are denoted by the same reference numerals, and a description thereof will be omitted or simplified.

Figure 14:
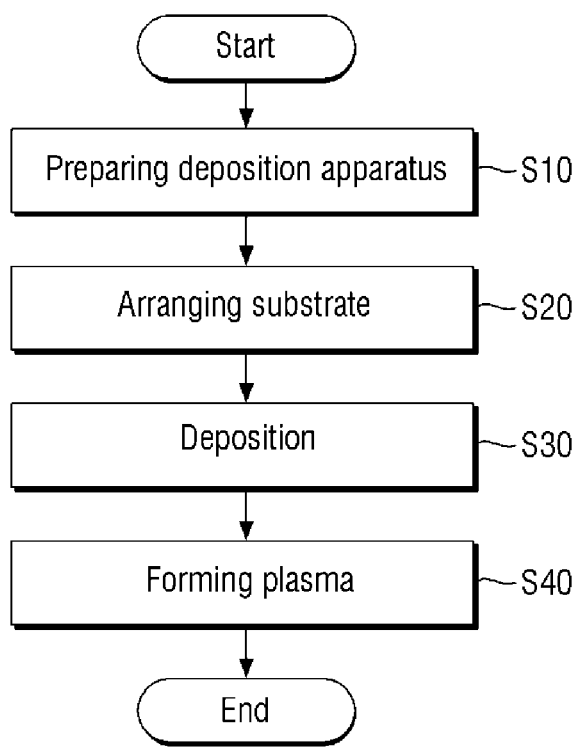
FIG. 14 is a flowchart illustrating an embodiment of a deposition method using a deposition apparatus.
Figure 15:
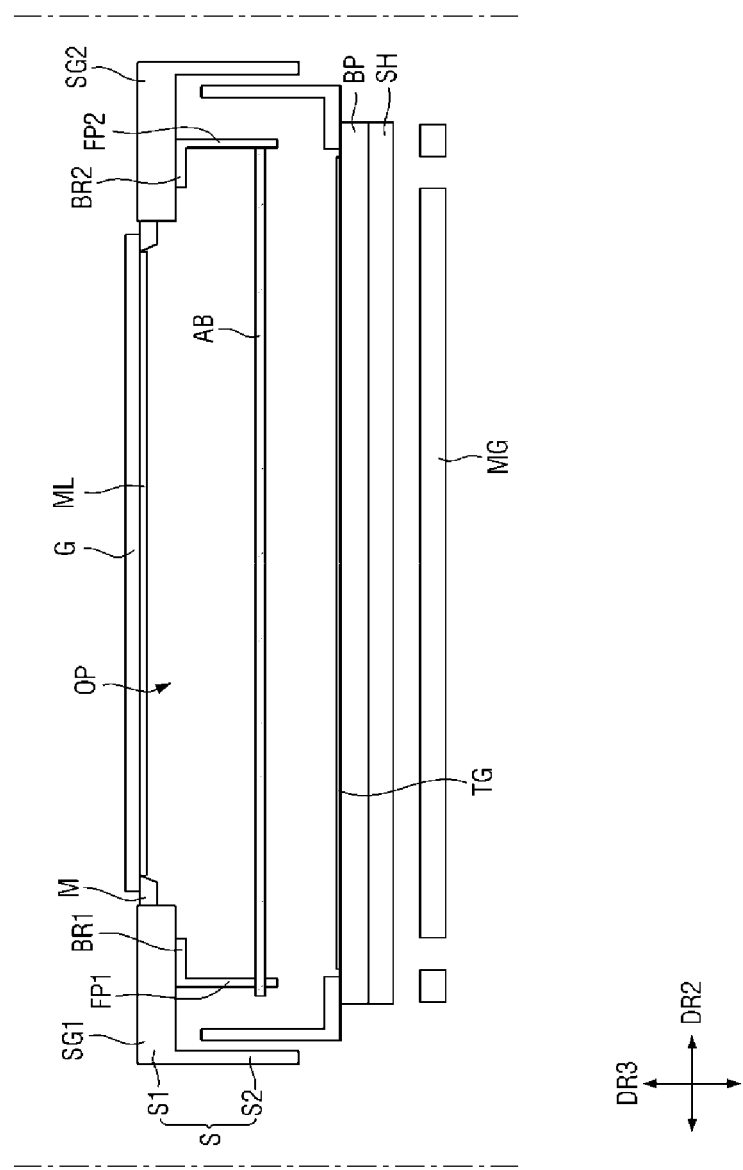
FIG. 15 is a cross-sectional view illustrating an embodiment of a processing operation of a deposition method.

FIG. 14 is a flowchart illustrating an embodiment of a deposition method using a deposition apparatus. FIG. 15 is a cross-sectional view illustrating an embodiment of a processing operation of a deposition method.

With reference to FIGS. 1, 2, and 14, the deposition apparatus 1 described with reference to FIGS. 1 and 2 is prepared at operation S10. As described above, the deposition apparatus 1 in an embodiment may include the shield member S, the bracket member BR, the substrate G, the mask member M, and the anode bar AB.

In more detail, the shield member S may have a lattice shape in the plan view.

The lattice-shaped shield member S may include short side edges extending along the first direction DR1 and long side edges extending along the second direction DR2. The lattice-shaped shield member S may define and surround an opening. That is, the opening of the shield member S may be completely surrounded by the lattice-shaped shield member S in the plan view.

The short side edges of the lattice-shaped shield member S may include an upper short side edge SG1 disposed at one side in the second direction DR2 and a lower short side edge SG2 disposed at the other side in the second direction DR2 to face the upper short side edge SG1.

The long side edges of the lattice-shaped shield member S may include a right long side edge LG2 disposed at one side in the first direction DR1 and a left long side edge LG1 disposed at the other side in the first direction DR1 to face the right long side edge LG2.

A length L1 of the long side edges of the lattice-shaped shield member S may be greater than a length L2 of the anode bar AB to be described later.

The shield member S may include a conductive material.

The mask member M may be arranged on the inner side surface of the shield member S. The mask member M may be arranged along the long side edges and the short side edges of the shield member S. The mask member M may have a lattice shape in the plan view. The mask member M may include long side edges adjacent to the long side edges of the shield member S and short side edges adjacent to the short side edges of the shield member S. An opening (refer to OP in FIG. 2) may be defined in and surrounded by the lattice-shaped mask member M. That is, the opening of the mask member M may be completely surrounded by the lattice-shaped mask member M.

The mask member M may be floated.

The substrate G may overlap the opening of the above-described shield member S in the thickness direction. The substrate G may be arranged in the opening of the above-described shield member S. That is, the substrate G may be smaller in planar size than the opening of the shield member S.

The substrate G may overlap the opening of the mask member M in the thickness direction. The substrate G may be greater in planar size than the opening of the above-described mask member M. That is, the substrate G may partly overlap the long and short side edges of the mask member M in the thickness direction.

The bracket member BR may be arranged on the short side edges of the shield member S. The bracket member BR may include a first bracket member BR1 arranged on the upper short side edge SG1 and a second bracket member BR2 arranged on the lower short side edge SG2. The bracket member BR may extend along the first direction DR1. The bracket member BR may be arranged on the inner side of the shield member S.

The ground voltage applied to the shield member S may be applied to the anode bar AB connected to the bracket member BR. Furthermore, the bracket member BR may physically separate the anode bar AB and the shield member S from each other.

The anode bar AB may extend along the second direction DR2. In an embodiment, a plurality of anode bars AB may be provided. The plurality of anode bars AB may be arranged along the first direction DR1. The anode bar AB may be coupled to the bracket member BR. The anode bar AB may be coupled to each of the first bracket member BR1 and the second bracket member BR2. The anode bar AB may protrude outward (in the second direction DR2) beyond at least one of the first and second bracket members BR1 and BR2 in the plan view. In an embodiment, the anode bar AB may protrude (or extend) outward (at one side in the second direction DR2) beyond the first bracket member BR1 and terminate inside the second bracket member BR2, for example.

The shield member S may include the upper shield member S1 and the lower shield member S2. The lower shield member S2 may be disposed below the upper shield member S1. The lower shield member S2 may be physically separated from the bracket member BR2.

The mask member M may adjoin the short and long side edges of the upper shield member S1. As described above, the substrate G may be arranged on the mask member M to cover the opening of the mask member M.

The first and second bracket members BR1 and BR2 may be connected to the bottom surfaces of the corresponding short side edges SG1 and SG2.

The first and second bracket members BR1 and BR2 may include respective fixing members FP1 and FP2. The fixing members FP1 and FP2 may each include a hole or a groove. In an embodiment, a hole may be defined in the fixing member FP1 of the first bracket member BR1, and a groove may be defined in the fixing member FP2 of the second bracket member BR2, for example.

In this case, the anode bar AB may be stably placed or fixed by the first bracket member BR1 so as to protrude (or extend) outward (in the second direction DR2) beyond the fixing member FP1 of the first bracket member BR1 and simultaneously may be stably placed or fixed by the fixing member FP2 of the second bracket member BR2 so as to terminate inside the fixing member FP2.

The anode bar AB may be stably placed by the first bracket member BR1 so as to protrude (or extend) outward (in the second direction DR2) beyond the fixing member FP1 of the first bracket member BR1 and simultaneously may be stably placed or fixed by the fixing member FP2 of the second bracket member BR2 so as to terminate inside the fixing member FP2, thereby allowing the anode bar AB which is not completely fixed to the first bracket member BR1 to sufficiently accommodate the thermal expansion caused by the heat produced by the plasma. This may make it possible to avoid any deflection of the anode bar AB caused by fixing the anode bar AB at both ends thereof, due to the thermal expansion.

The target member TG and the substrate G may cover a plurality of anode bars AB.

The target member TG may face the substrate G across the plurality of anode bars AB interposed therebetween. The target member TG may be greater in size than the substrate G, but is not limited thereto and may be substantially equal in size to the substrate G.

The target member TG may include a film forming material. A cathode is applied to the target member TG such that plasma may be produced between the cathode of the target member TG and the anode of the anode bar AB and the shield member S.

The deposition apparatus 1 may further include a backing plate BP for supporting the target member TG and the lower shield member S2. The backing plate BP may support the above-described target member TG and the lower shield member S2.

The deposition apparatus 1 may further include a shield layer SH arranged on the bottom surface of the backing plate BP. The shield layer SH may include an insulating material. Although not shown in FIG. 2, a common plate may be arranged on the bottom surface of the shield layer SH and the side surfaces of the shield layer SH, the backing plate BP, and the target member TG. The common plate may include the same conductive material as that of the above-described shield member S. The shield layer SH may electrically isolate the backing plate BP and the target member TG from the common plate including the conductive material.

A magnetic member MG may be further arranged below the shield layer SH.

The magnetic member MG may include a ferromagnetic substance. The magnetic member MG may guide the plasma to the surface of the target member TG. As a consequence, the plasma may effectively bombard the target member TG to facilitate the sputtering process.

Next, the substrate G is arranged at operation S20 as shown in FIG. 14 as described with reference to FIGS. 1 and 2.

More specifically, the substrate G may overlap the opening of the above-described shield member S in the thickness direction. The substrate G may be arranged in the opening of the above-described shield member S. That is, the substrate G may be smaller in planar size than the opening of the shield member S. The substrate G may include a rigid material such as glass or quartz. However, the invention is not limited thereto, and the substrate G may include a flexible material such as polyimide. The substrate G may also overlap the opening of the mask member M in the thickness direction. The substrate G may be greater in planar size than the opening of the above-described mask member M. That is, the substrate G may partly overlap the long and short side edges of the mask member M in the thickness direction.

Next, the plasma is produced at operation S30 as shown in FIG. 14 as described with reference to FIG. 5.

More specifically, as described above with reference to FIG. 5, the cathode is applied to the target member TG and the anode is applied to the shield member S and the anode bars AB such that plasma is produced between the target member TG and the shield member S and anode bars AB.

Next, a film forming material ML is deposited on the substrate G at operation S40 as shown in FIGS. 14 and 15.

The film forming material ML is a film forming material sputtered from the target member TG. In an embodiment, the film forming material ML may include, but is not limited thereto, aluminum (Al), molybdenum (Mo), titanium (Ti), silver (Ag), or ITO, for example.

Figure 16:
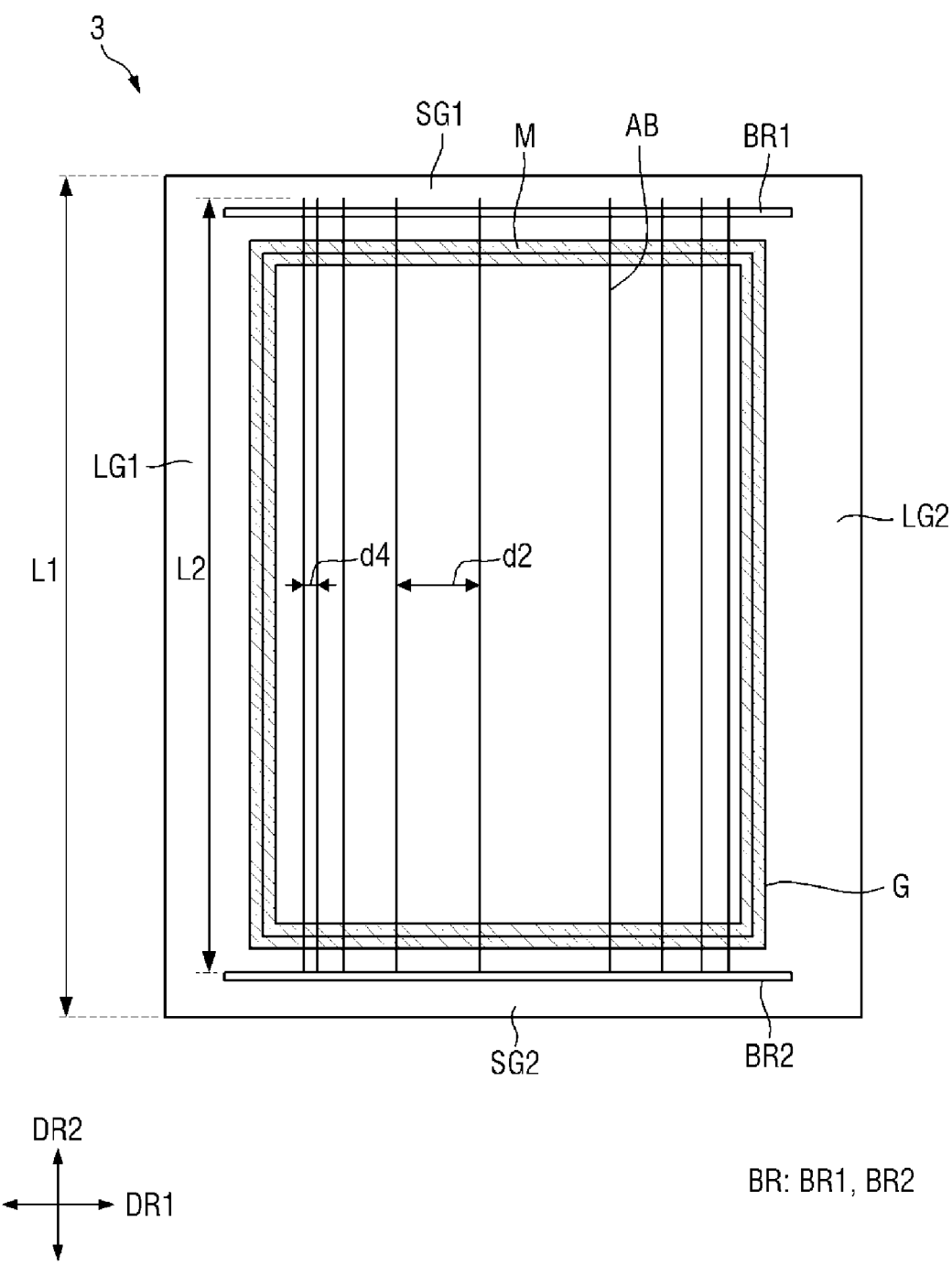
FIG. 16 is a plan view of another embodiment of a deposition apparatus.
Figure 17:
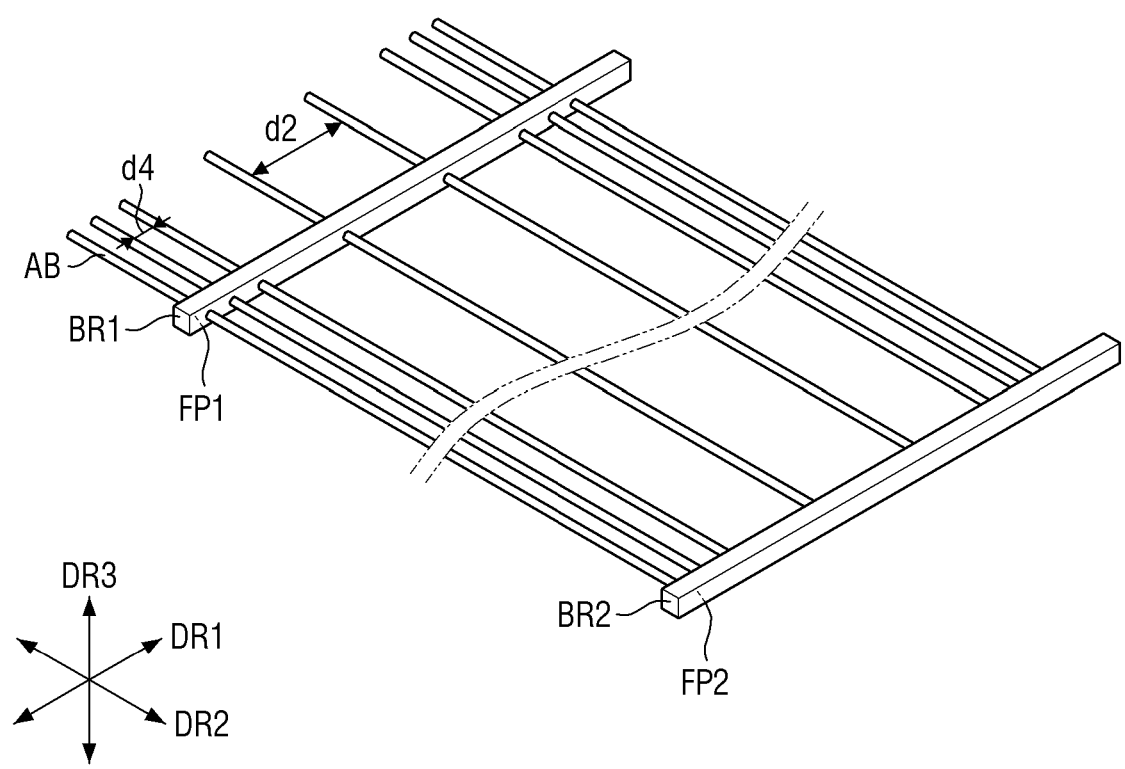
FIG. 17 is a perspective view illustrating another embodiment of a connection relationship of anode bars and bracket members.

FIG. 16 is a plan view of another embodiment of a deposition apparatus. FIG. 17 is a perspective view illustrating another embodiment of a connection relationship of anode bars and bracket members.

With reference to FIGS. 16 and 17, a deposition apparatus 3 according to this embodiment differs from the deposition apparatus 1 according to the above embodiment in that the anode bar AB has a first width d1 (refer to FIG. 3) and the adjacent anode bars AB are arranged at different intervals of separation distances d2 and d4 depending on the locations thereof.

In more detail, the deposition apparatus 3 includes the anode bars AB each having the first width d1 and arranged at different intervals of separation distances d2 and d4 depending on the locations thereof.

The separation distances d2 and d4 of the anode bars AB may have a second separation distance d2 in the central area in the first direction DR1 within the opening (refer to OP in FIG. 2), and a fourth separation distance d4 in the outer area in the first direction DR1 within the opening (refer to OP in FIG. 2).

The fourth separation distance d4 may be smaller than the second separation distance d2. The fourth separation distance d4 may be less than 50% of the second separation distance d2. The shorter the separation distances d2, d4 between the adjacent anode bars AB, the more uniform the intensity density of plasma at the corresponding overlap areas.

According to this embodiment, the separation distances d2 and d4 of the anode bars AB are configured such that the fourth separation distance d4 is smaller than the second separation distance d2, which makes it possible for the intensity density of the plasma to become more uniform in outer areas in first direction DR1 within the opening (refer to OP in FIG. 2).

Although embodiments of the invention have been disclosed for illustrative purposes, those skilled in the art will appreciate that various modifications, additions and substitutions are possible.

What is claimed is:

1. A deposition apparatus comprising:
    a shield member including short side edges extending along a first direction and long side edges extending along a second direction crossing the first direction, the short side edges including a first short side edge and a second short side edge;
    a bracket member including a first bracket member disposed on the first short side edge and coupled to the first short side edge, and a second bracket member disposed on the second short side edge and coupled to the second short side edge;
    a plurality of anode bars extending along the second direction and placed on each of the first bracket member and the second bracket member; and
    a target member covering the plurality of anode bars,
    wherein an anode bar of the plurality of anode bars protrudes outward beyond at least one of the first bracket member and the second bracket member,
    the anode bar is physically separated from the shield member by the bracket member,
    the shield member includes a first shield member including the first short side edge, and a second shield member including the second short side edge,
    a hole is defined in the fixing member of the first bracket member,
    a groove is defined in the fixing member of the second bracket member, and
    a first end of the anode bar protrudes outward through the hole of the first bracket member,
    wherein at least a part of the bracket member has an embossed surface.

2. The deposition apparatus of claim 1, wherein each of the first bracket member and the second bracket member has the embossed surface.

3. The deposition apparatus of claim 1, wherein each of the plurality of anode bars has an embossed surface.

4. The deposition apparatus of claim 3, wherein the bracket member has a plurality of first embossed patterns, and each of the plurality of anode bars has a plurality of second embossed patterns, and
    wherein sizes of the first embossed patterns are different from sizes of the second embossed patterns.

5. The deposition apparatus of claim 1, wherein the shield member is applied with a predetermined voltage.

6. The deposition apparatus of claim 5, wherein the shield member is configured to act as an anode for plasma generation.

7. The deposition apparatus of claim 1, wherein the plurality of anode bars are spaced apart along the first direction and electrically grounded.

8. The deposition apparatus of claim 7, wherein the anode bar has a first width,
    adjacent anode bars of the plurality of anode bars are spaced apart at a first separation distance, and
    the first separation distance is equal to or greater than double the first width.

9. The deposition apparatus of claim 7, wherein a long side edge of the long side edges of the shield member has a first length, and
    the anode bar has a second length shorter than the first length.

10. The deposition apparatus of claim 9, wherein the shield member includes an upper shield member coupled to the bracket member, and
    the upper shield member includes a first extension portion coupled to the bracket member, and a second extension portion connected to the first extension portion, disposed on a lateral side of the anode bar and extending along a third direction perpendicular to the first and second directions.

11. The deposition apparatus of claim 10, wherein the shield member includes a lower shield member spaced apart from the bracket member, and
    the lower shield member includes a third extension portion disposed on a lateral side of the target member, and a fourth extension portion connected to the third extension portion, extending along the third direction and disposed on a lateral side of the anode bar.

12. A deposition apparatus comprising:
    a shield member including a portion extending in a first direction;
    a plurality of anode bars extending in a second direction perpendicular to the first direction and spaced apart from the shield member;
    a bracket member coupled to the portion of the shield member and the plurality of anode bars;
    wherein at least a part of the bracket member has an embossed pattern on a surface of the bracket member, and
    the embossed pattern has a same material as a material of the bracket member.

13. The deposition apparatus of claim 12, wherein each of the plurality of anode bars has an embossed surface.

14. The deposition apparatus of claim 13, wherein the bracket member has a plurality of first embossed patterns, and each of the plurality of anode bars has a plurality of second embossed patterns, and wherein sizes of the first embossed patterns are different from sizes of the second embossed patterns.

* * * * *